United States Patent
Christoph

(10) Patent No.: US 6,529,605 B1
(45) Date of Patent: Mar. 4, 2003

(54) METHOD AND APPARATUS FOR DYNAMIC SOUND OPTIMIZATION

(75) Inventor: Markus Christoph, Straubing (DE)

(73) Assignee: Harman International Industries, Incorporated, Northridge, CA (US)

( * ) Notice: Subject to any disclaimer, the term of this patent is extended or adjusted under 35 U.S.C. 154(b) by 405 days.

(21) Appl. No.: 09/606,726

(22) Filed: Jun. 29, 2000

(30) Foreign Application Priority Data

Apr. 14, 2000 (DE) .................................... 100 18 666

(51) Int. Cl.[7] .............. H04R 29/00; H03G 3/20; H04B 15/00; H04B 1/00; H03B 29/00
(52) U.S. Cl. .............. 381/56; 381/57; 381/58; 381/94.7; 381/86; 381/71.4
(58) Field of Search .............. 381/56–58, 104, 381/106, 107, 108, 86, 71.4, 94.7

(56) References Cited

U.S. PATENT DOCUMENTS

| | | | |
|---|---|---|---|
| 3,714,622 A | 1/1973 | Wilhelmsen | 367/2 |
| 3,934,084 A | 1/1976 | Munson et al. | 381/57 |
| 3,934,085 A | 1/1976 | Munson et al. | 381/57 |
| 4,025,723 A | 5/1977 | Blackledge | 381/106 |
| 4,223,181 A | 9/1980 | Simeau | 381/94 |
| 4,247,955 A | 1/1981 | Weidemann | 381/57 |
| 4,254,303 A | 3/1981 | Takizawa | 381/107 |
| 4,297,527 A | 10/1981 | Pate | 381/107 |
| 4,306,115 A | 12/1981 | Humphrey | 381/107 |
| 4,380,824 A | 4/1983 | Inoue | 381/86 |
| 4,406,923 A | 9/1983 | Burne, III et al. | 381/108 |
| 4,409,435 A | 10/1983 | Ono | 381/44.3 |
| 4,438,526 A | 3/1984 | Thomalla | 381/73.1 |
| 4,461,025 A | 7/1984 | Franklin | 381/56 |
| 4,476,571 A | 10/1984 | Tokumo et al. | 381/57 |
| 4,479,237 A | 10/1984 | Sugasawa | 381/57 |
| 4,553,258 A | 11/1985 | Chainer et al. | 381/120 |
| 4,590,593 A | 5/1986 | Rodney | 367/83 |
| 4,598,417 A | 7/1986 | Deno | 381/57 |
| 4,628,526 A | 12/1986 | Germer | 381/57 |
| 4,636,586 A | 1/1987 | Schiff | 381/71.12 |
| 4,641,344 A | 2/1987 | Kasai et al. | 381/86 |
| 4,649,505 A | 3/1987 | Zinser, Jr. et al. | 381/71.12 |
| 4,672,674 A | 6/1987 | Clough et al. | 381/71.12 |
| 4,677,389 A | 6/1987 | Op de Beek et al. | 381/120 |
| 4,696,030 A | 9/1987 | Egozi | 381/94.7 |
| 4,696,044 A | 9/1987 | Waller, Jr. | 381/98 |
| 4,718,099 A | 1/1988 | Hotvet | 381/106 |
| 4,723,294 A | 2/1988 | Taguchi | 381/94.2 |
| 4,731,850 A | 3/1988 | Levitt et al. | 381/92 |
| 4,751,739 A | 6/1988 | Serikawa et al. | 381/104 |

(List continued on next page.)

FOREIGN PATENT DOCUMENTS

| | | |
|---|---|---|
| DE | 3220758 | 12/1983 |
| DE | 3320751 | 12/1984 |
| DE | 3322055 | 12/1984 |

(List continued on next page.)

OTHER PUBLICATIONS

Wang Peng, Wee Ser, Ming Zhang: Bark Scale Equalizer Design Using Warped Filter, XP–002189832, pp. 3317–3320.

(List continued on next page.)

*Primary Examiner*—Minsun Oh Harvey
*Assistant Examiner*—Laura A. Grier
(74) *Attorney, Agent, or Firm*—Harness, Dickey & Pierce, P.L.C.

(57) ABSTRACT

A device and a method is presented in which an adjustment to the noise conditions is made for the purpose of controlling the volume and other variables of a desired signal offered in a monitored space, in the course of which, for the purpose of adjustment, a monitoring signal occurring at the monitoring point is picked up and split into a desired-signal component and a noise-signal component. These two components then become the basis for the adjustment.

12 Claims, 1 Drawing Sheet

U.S. PATENT DOCUMENTS

| | | | |
|---|---|---|---|
| 4,769,847 A | 9/1988 | Taguchi | 381/94.7 |
| 4,823,391 A | 4/1989 | Schwartz | 381/103 |
| 4,827,458 A | 5/1989 | D'Alayer de Costemore D'Arc | 381/57 |
| 4,837,834 A | 6/1989 | Allie | 381/71.14 |
| 4,852,175 A | 7/1989 | Kates | 381/73.1 |
| 4,864,246 A | 9/1989 | Kato et al. | 330/136 |
| 4,887,299 A | 12/1989 | Cummins et al. | 381/106 |
| 4,891,605 A | 1/1990 | Tirkel | 330/129 |
| 4,953,221 A | 8/1990 | Holly et al. | 381/108 |
| 4,956,867 A | 9/1990 | Zurek et al. | 381/94.7 |
| 4,965,834 A | 10/1990 | Miller | 381/94.7 |
| 5,018,202 A | 5/1991 | Takahashi et al. | 381/71.5 |
| 5,018,205 A | 5/1991 | Takagi et al. | 381/86 |
| 5,048,091 A | 9/1991 | Sato et al. | 381/107 |
| 5,068,834 A | 11/1991 | Fromont | 367/135 |
| 5,077,799 A | 12/1991 | Cotton | 381/57 |
| 5,081,682 A | 1/1992 | Kato et al. | 381/57 |
| 5,089,997 A | 2/1992 | Pecukonis | 367/135 |
| 5,107,539 A | 4/1992 | Kato et al. | 381/57 |
| 5,117,401 A | 5/1992 | Feintuch | 367/135 |
| 5,126,681 A | 6/1992 | Ziegler, Jr. et al. | 327/552 |
| 5,131,047 A | 7/1992 | Hashimoto et al. | 381/71.11 |
| 5,146,505 A | 9/1992 | Pfaff et al. | 381/103 |
| 5,146,507 A | 9/1992 | Satoh et al. | 381/86 |
| 5,204,971 A | 4/1993 | Takahashi et al. | 381/86 |
| 5,208,866 A | 5/1993 | Kato et al. | 381/57 |
| 5,226,016 A | 7/1993 | Christman | 381/94.2 |
| 5,243,661 A | 9/1993 | Ohkubo et al. | 381/94.2 |
| 5,255,324 A | 10/1993 | Brewer et al. | 381/107 |
| 5,267,322 A | 11/1993 | Smith et al. | 330/149 |
| 5,291,558 A | 3/1994 | Ross | 381/107 |
| 5,293,425 A | 3/1994 | Oppenheim et al. | 381/718 |
| 5,311,446 A | 5/1994 | Ross et al. | 330/149 |
| 5,325,437 A | 6/1994 | Doi et al. | 381/71.9 |
| 5,416,846 A | 5/1995 | Tamura et al. | 381/71.8 |
| 5,434,922 A | 7/1995 | Miller et al. | 381/57 |
| 5,434,926 A | 7/1995 | Watanabe et al. | 381/108 |
| 5,450,494 A | 9/1995 | Okubo et al. | 381/108 |
| 5,485,523 A | 1/1996 | Tamamura et al. | 381/71.4 |
| 5,530,761 A | 6/1996 | d'Alayer de Costemore d'Arc | 381/57 |
| 5,539,832 A | 7/1996 | Weinstein et al. | 381/94.1 |
| 5,615,270 A | 3/1997 | Miller et al. | 381/57 |
| 5,635,903 A * | 6/1997 | Koike et al. | 340/384.1 |
| 5,666,426 A | 9/1997 | Helms | 381/57 |
| 5,774,565 A | 6/1998 | Benning et al. | 381/83 |
| 5,796,847 A | 8/1998 | Kaihotsu et al. | 381/57 |
| 5,844,992 A | 12/1998 | Boyer | 381/57 |
| 5,872,852 A * | 2/1999 | Dougherty | 381/104 |
| 6,061,455 A * | 5/2000 | Hadley et al. | 381/107 |
| 6,072,881 A * | 6/2000 | Linder | 381/94.1 |
| 6,078,670 A * | 6/2000 | Beyer | 381/101 |
| 2001/0055400 A1 | 12/2001 | Lubbe et al. | |

FOREIGN PATENT DOCUMENTS

| | | |
|---|---|---|
| DE | 3338413 | 5/1985 |
| DE | 42043857 | 8/1993 |
| DE | 198 32 472 A1 | 7/1998 |
| DE | 19736699 | 2/1999 |
| EP | 017519 | 10/1980 |
| EP | 0141129 | 5/1985 |
| EP | 0319777 | 6/1989 |
| EP | 0548181 B1 | 5/1991 |
| EP | 319777 | 8/1994 |
| EP | 0623995 | 11/1994 |
| EP | 0632586 | 1/1995 |
| EP | 964 512 A2 | 6/1999 |
| GB | 217066 | 6/1924 |
| GB | 2013051 | 8/1979 |
| GB | 2257317 | 1/1993 |
| JP | 57207410 | 12/1982 |
| JP | 61108212 | 5/1986 |
| JP | 62092607 | 4/1987 |
| JP | 03175807 | 7/1991 |
| JP | 4047705 | 2/1992 |
| JP | 4070106 | 3/1992 |
| JP | 4094204 | 3/1992 |
| JP | 4302204 | 10/1992 |
| JP | 4365210 | 12/1992 |
| JP | 05037270 | 2/1993 |
| JP | 05220361 | 4/1993 |
| JP | 05259779 | 10/1993 |
| JP | 06069742 | 3/1994 |
| JP | 9116361 | 2/1997 |
| JP | 91116362 | 5/1997 |
| WO | WO 92/04772 | 3/1992 |
| WO | WO98/16999 | 4/1998 |
| WO | WO 00/04636 | 1/2000 |

OTHER PUBLICATIONS

T. Gulzow, A. Engelsberg, U. Heute: Comparison of a discrete wavelet transformation and a nonuniform polyphase filterbank applied to spectral–subtraction speech enhancement, Oct. 9, 1997, pp. 5–19.

Aki Harma: Implementation of frequency–warped recursive filters, pp. 543–548.

Schussler, W; Winkelnkemper, W; "Variable Digital Filters" Arch. Elektr. Ubertr. (AEU), Band 24, 1970, Heft 11, Seiten 524–525.

* cited by examiner

METHOD AND APPARATUS FOR DYNAMIC SOUND OPTIMIZATION

BACKGROUND OF THE INVENTION

1. Technical Field

The invention relates to a device and a method for the noise-dependent adjustment of a desired acoustic signal radiated at a monitoring point.

2. Discussion

When music or speech is offered in a noise-filled environment via an electro-acoustic system, pleasurable hearing is generally muddied by the background noise. A noise-filled space in which music and speech are frequently heard is, for instance, the passenger compartment of a motor vehicle. The background noise can originate from the engine, the tires, the blower and other units in the motor vehicle and be a function of the speed, road conditions and the operating conditions in the motor vehicle. The occupant of the motor vehicle reacts to this time-varying backdrop by accordingly turning the volume control to adjust the desired signals offered in the form of music or speech.

For example, a method and a device for the dynamic optimization of sound are known from U.S. Pat. Nos. 5,434,922 and 5,615,270, both entitled "Method and Apparatus for Dynamic Sound Optimization." These patents disclose a method and device in which the volume of the desired signal is automatically adjusted as a function of the background noise. With it, the overall sound in the monitored space is evaluated in such a manner by means of a microphone so that the signal corresponding to the overall sound is fed to an extractor which extracts the noise-signal component from the overall sound. In a subsequent amplification-evaluation stage, this extracted noise-signal component is compared with the original signal from the sound source. The results of this comparison are then used for setting the volume of the desired acoustic signal.

What is problematic with this device and the method on which it is based, however, is that extracting of the noise-signal component does not entirely succeed, so that components of the desired signal are also contained in the extracted noise-signal component. Thus, the entire device is based on a noise level which is higher than the actual noise level. However, a higher volume is set which increases the volume. The effect of a higher volume set is that the desired-signal component remaining in the extracted noise-signal component also increases. This phenomenon, also described as "gain chase," would thereby end in the maximum possible volume level, so that either the listener positioned in the motor vehicle must manually intervene in the event or—as in U.S. Pat. Nos. 5,434,922 and 5,615,270 implement a considerably more expensive system in order to suppress the "gain chase."

Therefore, a principal object of the present invention is to provide a device and a method for the noise-dependent adjustment of a desired acoustic signal radiated at a monitoring point in which the gain-chase effect is reduced. In that way, an automatic increase in volume is reduced.

In is a further object of the present invention to provide such a method and device that improves over accuracy of prior art methods and devices and which is cost effective and efficient.

SUMMARY OF THE INVENTION

The foregoing objects of the present invention are achieved by a device having a signal source for the generation of a desired electrical signal as well as a signal-processing apparatus that are connected in series at the output end of the signal source and are adjusted by means of a control signal for the generation of a processed desired electrical signal. Furthermore, a sound-converting apparatus is connected in series at the output end of the signal-processing apparatus for the generation of the desired acoustic signal from the processed desired electrical signal, and a sound pickup for the generation of an electrical monitoring signal from the desired acoustic signal on which an acoustic noise signal is superimposed, are provided at the monitoring point.

Finally, an extractor is connected in series at the output end of the sound pickup for the purpose of extracting the noise-signal component contained in the monitoring signal. Connected in series at the output end of the extractor, in turn, is a controlling apparatus which receives the noise component of the monitoring signal and at least one additional signal derived from the monitoring signal, and which generates from both, the control signal for the signal-processing apparatus.

More particularly, at least one additional signal derived from the monitoring signal corresponds preferably to the sum of the desired-signal component and a spurious-signal component and/or the desired-signal component of the monitoring signal. Also, a signal derived from the monitoring signal can also be provided by the extractor.

Furthermore, a state signal can be applied to the controlling apparatus. With it, the volume and/or other variables of the desired signal can be influenced by additional information, e.g., not only from the volume setting (by means of the volume control, for instance) but also, in the case of installation in motor vehicles, from the vehicle speed and engine speed, for example.

The extractor preferentially has at least one adaptive filter. This can, for example, function according to the least mean square method.

For extracting the noise-signal component from the monitoring signal, the extractor can be connected to the signal source, from which it receives the desired signal, or be connected to the signal-processing apparatus, from which it receives the processed desired signal.

The method according to invention appropriately provides for the generation of a desired electrical signal, the processing of it as a function of a control signal, and the generation of the desired acoustic signal from the processed desired electrical signal. With that, an electrical monitoring signal, defined by the desired acoustic signal on which an acoustic noise signal is superimposed, is audited at the monitoring point; the noise-signal component contained in the monitoring signal is then extracted; and the noise-signal component contained in the monitoring signal is combined with a signal derived from the monitoring signal, producing the control signal.

Signals derived from the monitoring signal can, in turn, correspond to the sum of desired-signal component and spurious-signal component of the monitoring signal and/or to the derived from the monitoring signal, i.e., the desired-signal component.

BRIEF DESCRIPTION OF THE DRAWINGS

The various advantages of the present invention will become apparent to one skilled in the art upon reading the following specification, in which.

DESCRIPTION OF THE PREFERRED EMBODIMENT

It should be understood from the outset that while the following discussion illustrates particular embodiments of the present invention, these embodiments merely represent a best mode of currently practicing the invention and other modifications may be made to the particular embodiments without departing from the spirit and scope of the invention.

Figure 1:
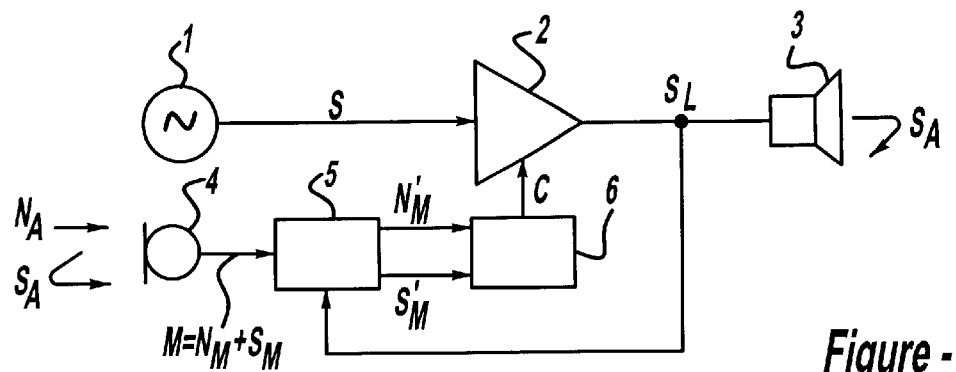
FIG. 1 shows a first embodiment of a device according to the present invention.

The first embodiment of a device according to the present invention is shown in FIG. 1. The device comprises a signal source 1 such as, for instance, a CD player, an MP3 player, a radio receiver, an audio cassette player or other sound carrier/reproduction apparatus, which emits a desired signal S. The desired signal S is fed to a regulating apparatus 2, which is connected in series at the output end of the sound source 1. A control signal C varies the volume and/or other signal characteristics, such as, for instance, degree of compression, sound, and of the desired signal S, producing a processed desired signal $S_L$. The processed desired signal $S_L$ is then fed to a sound-radiating apparatus 3 which produces a desired acoustic signal $S_A$ from the processed desired electrical signal $S_L$. At the same time, in addition to one or a plurality of speakers, the sound-radiating apparatus can also have related output stages, as well as appropriate digital-analog converters in the case of digital controlling.

A microphone 4 serving as a sound pickup receives the desired acoustic signal $S_A$ and an acoustic noise signal $N_A$, which, in the case of a motor vehicle's passenger compartment, for instance, is composed of road noise, engine noise and/or other noise in the passenger compartment. In the microphone 4, the acoustic noise signal $N_A$ is superimposed on the desired electrical signal $S_A$. The microphone 4 accordingly generates an electrical monitoring signal M from the desired acoustic signal $S_A$ and the acoustic noise signal $N_A$. Following its conversion from the desired acoustic signal $S_A$ and the acoustic noise signal $N_A$ via the microphone, this electrical monitoring signal M is equal to the sum of the spurious Signal $N_M$ and the desired signal $S_M$. The monitoring signal M is applied to an extractor 5, which generates an extracted desired signal $S'_M$ and an extracted noise signal $N'_M$ from the monitoring signal M and, therewith, from the sum of the desired signal at the microphone $S_M$ and the noise signal $N_M$ at the microphone 4. The control signal C is then formed from extracted desired signal $S'_M$ and extracted noise signal $N'_M$ by means of a controlling apparatus 6.

The reproduction signal path extends from the signal source 1 to the sound-radiating apparatus 3, in conjunction with which the sound reproduction, i.e., volume, tone, compression, etc., for instance, can be influenced by the regulating apparatus 2.

The regulating apparatus 2 is controlled by the control signal C which is derived from the processed desired signal $S_L$, and which are the monitoring signal M fed to the extractor 5. The desired electrical signal $S_M$ and the post-microphone noise signal $N_M$, which the extractor 5 splits into the two components forming the monitoring signal M, corresponds to the respective desired acoustic signal $S_A$ and the acoustic noise signal $N_A$ output by microphone 4. Accordingly, the extracted desired signal $S'_M$ and the extracted noise signal $N'_M$ are obtained. The extracted noise signal $S'_M$ essentially corresponds to the desired acoustic signal $S_A$, which is folded with the impulse response from the space enclosing the monitoring point. Finally, the signal $N'_M$ corresponds to the prevailing ambient noise.

In order to minimize the error contained in the extracted noise signal $N'_M$, the extracted desired signal $S'_M$ also is fed into the controlling apparatus 6. The extracted desired signal $S'_M$ simulates the desired-signal component, namely, the signal $S_M$, as contained in the monitoring signal M. The extractor 5 generates the extracted desired signal $S'_M$ from the processed desired signal $S_L$ such that the processed desired signal $S_L$ is folded with the spatial impulse response simulated in the extractor 5. The desired signal $S'_M$ thus corresponds in close approximation to the desired acoustic signal $S_A$.

Figure 2:
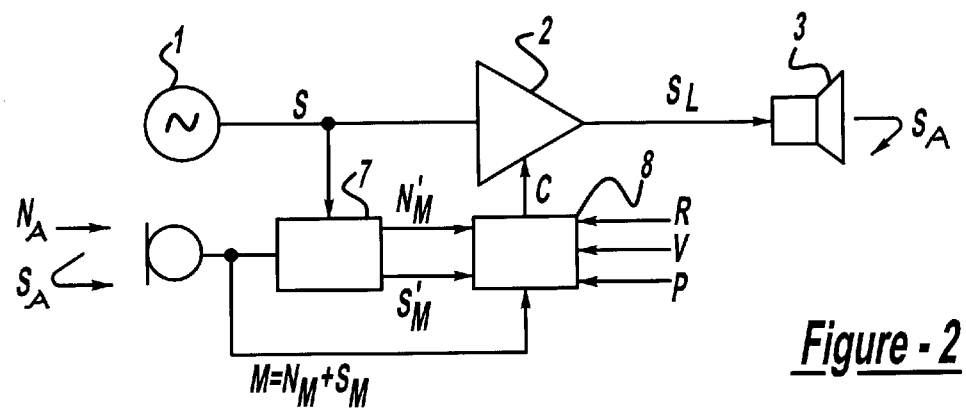
FIG. 2 shows a second embodiment of a device according to the present invention.

A second embodiment of the present invention is shown in FIG. 2. Compared with that shown in FIG. 1, the second embodiment according to FIG. 2 is modified with the intent that, in place of the extractor 5, an extractor 7 is provided. Extractor 7 does not receive the processed desired signal $S_L$, but does receive the desired signal S from the output of the signal source 1. Furthermore, in place of the controlling apparatus 6, a controlling apparatus 8 is provided. Besides being triggered by the extracted desired signal $S'_M$ and the extracted noise signal $N'_M$, controlling apparatus 8 is also triggered by the monitoring signal M as well as by state signals R, V and P. The state signal R refers to the current engine speed, the state signal V to the speed of the vehicle, and the state signal P to the volume control setting. With respect to the subject invention, for instance, in FIG. 1 the extracted desired signal $S'_M$ is compared within the controlling apparatus 6 or 8, for forming the control signal C.

The particular advantage in using the extracted desired signal $S'_M$, compared with the desired signal S radiated from the signal source 1 or the processed desired signal $S_L$, is that the extracted desired signal $S'_M$ corresponds to the source signal prevailing in the monitored space (as it is picked up by the microphone 4). $S'_M$ best reproduces the true conditions of the monitored space. The advantage in generally using the processed desired signal $S_L$ as opposed to the desired signal S from sound source 1 is that the modifications made to the desired signal S in the regulating apparatus 2 do not have to be duplicated by the extractor 5. Extractor 5 and extractor 7 include an adaptive filter selected from a plurality of known possible adaptive filters such as LMS filters, RLS filters, QR decomposition LS filters, LS lattice filters, QR decomposition lattice filters, gradient adaptive lattice filters, etc. The selected adaptive filter preferably functions according to the methods of the least mean square (LMS) or the method of the delayed least mean square (DLMS), so that they can be utilized very effectively and efficiently with the aid of a digital signal processor.

Figure 3:
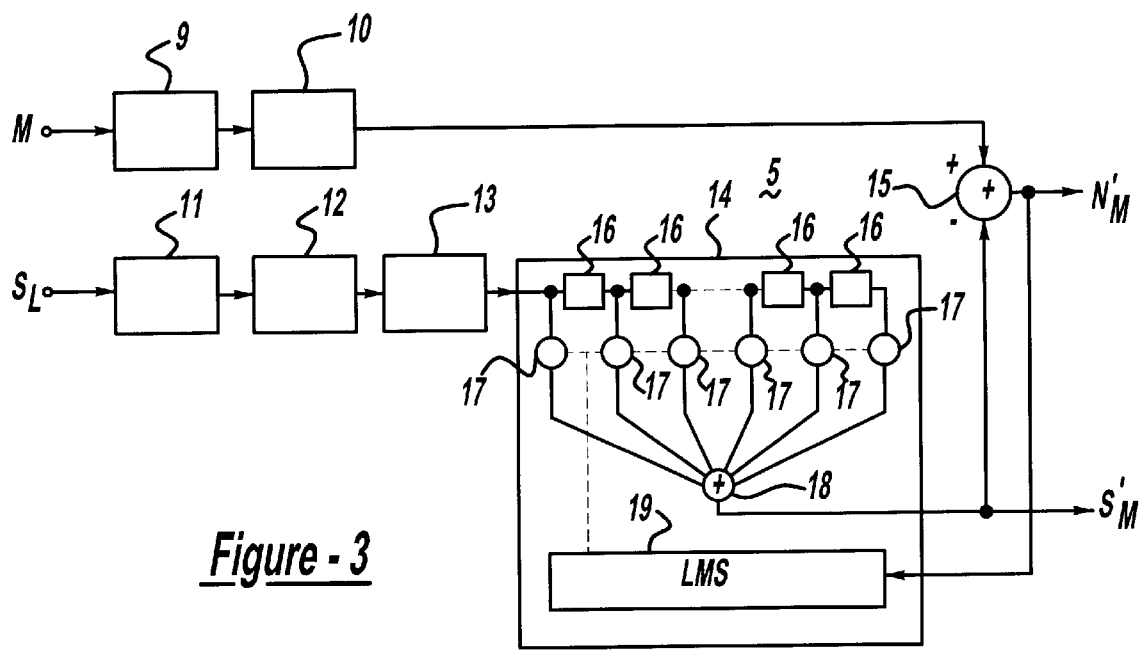
FIG. 3 shows an adaptive filter for use with the device according to the first embodiment of the invention shown in FIG. 1.

FIG. 3 shows a preferred exemplary embodiment for an adaptive filter used in the extractor 5 according to FIG. 1. Generally, a specific adaptive filter would preferably be required for every spatially-located sound-reproducing device which is triggered by the processed desired signal $S_L$. Because of limited available computer power, such a configuration is not practical. An error is output if the noise-signal component in the monitoring signal M, namely, the extracted noise signal $S'_M$, is calculated using only one or two adaptive filters and not, as is preferred, by using the same number of adaptive filters as there are sound-reproducing apparatuses in the entire system.

This error becomes evident in the extracted noise signal $N'_M$. The error, can be minimized, however, if the sum signal of the processed amplifier output signals or the speaker triggering signals is used for extracting the desired signal $S'_M$.

In addition to this, the filter core of the adaptive filter is a conventional filter, such as a finite impulse response (FIR) or infinite impulse response (IIR) filter. As a result, errors again occur which become evident in the extracted noise signal $N'_M$. In the exemplary embodiment, a conventional FIR filter is used as the filter core of the adaptive filter in the extractor 5 according to FIG. 1. With that, a fast and simple calculation of the current coefficients is possible by using the LMS method (gradient decrease method).

In particular, the extractor 5 from FIG. 1 comprises, in accordance with FIG. 3, a sampling rate reduction apparatus 9 to which the monitoring signal M is fed and which is connected in series to the output end of a filter 10, which may be an equalizer. A second signal path for the processed desired signal $S_L$ appropriately contains a sampling rate reduction apparatus 11 at the output end of which a filter 12, which may be an equalizer, is connected in series, to which a delay apparatus 13 is then connected. The filter core 14 of an adaptive filter, the output signal of which is extracted from the output signal of the filter 10 by means of a subtractor 15, connects to the delay apparatus 13. The extracted noise signal $N'_M$ is then available at the output of the subtractor 15. Accordingly, the extracted desired signal $S'_M$ can be tapped at the output of the filter core 14. The filter core 14 essentially comprises a non-recursive filter component having a plurality of delay elements 16 connected in series whose taps are directed to an analog adder 18 by the interpositioning of coefficient elements 17. The output of the analog adder 18 constitutes the output of the filter core 14 and, accordingly, carries the extracted desired signal $S'_M$. The coefficient elements 17 are simultaneously controlled by a coefficient calculation apparatus 19 which functions according to the method of the least mean square (LMS). Using the extracted noise signal $N'_M$ as a basis, the coefficient calculation apparatus 19 adjusts the coefficient elements 17.

For the filter core 14 with FIR filter structure, the frequency resolution df can very easily be calculated from filter length l:

$$df = f_a/l,$$

where $f_a$ is the sampling frequency in Hertz, l the filter length in taps, and df the frequency resolution in Hertz. It is immediately evident from the equation how the filter length l and the sampling frequency $f_a$, affects df and the quality of the adaptive filter.

Consequently, the greater the filter length l or the smaller the sampling frequency $f_a$, the greater the frequency resolution df, that is, the interaction between the individual spectral lines. With this, the quality or the error increases or decreases, respectively, in the extracted noise signal $N'_M$ output by the adaptive filter. Limiting the wave band being analyzed to an upper cut-off frequency of around 1 kHz is tolerable for many installations, such as in a motor vehicle, for instance. All signals supplied to either extractor 5 or 7 can therefore be sub-sampled, for example at a new sampling frequency of $f_a$=2 kHz. Compared with the original sampling frequency $f_a$, not only is there a gain in computing time, but also a significant increase in frequency resolution under conditions of constant filter length is achieved. Consequently, implementation expense is drastically reduced.

Although the adaptive filter was explained with regard to the exemplary embodiment according to FIG. 1, it can, however, be applied in the same way for the specific embodiments according to FIG. 2.

Various other advantages and modifications will become apparent to one skilled in the art after having the benefit of studying the teachings of the specification, the drawings, and the following claims.

What is claimed is:

1. A device for the noise-dependent adjustment of a desired acoustic signal radiated at a monitoring point, said device comprising:

a signal source comprising an output comprising a desired electrical signal;

a signal processor comprising an input comprising said desired electrical signal;

a sound pickup located at said monitoring point, said sound pickup comprising an input and an output, said input comprising said desired acoustic signal and an acoustic noise signal, and said output comprising a monitoring signal derived from said desired acoustic signal and said acoustic noise signal;

an extractor comprising an input and an output, said input comprising said monitoring signal, and said output comprising a noise-signal component of said monitoring signal;

a controller comprising an input and an output, said input comprising said noise-signal component of said monitoring signal and at least one additional signal derived from said monitoring signal, and said output comprising a control signal;

said input of said signal processor further comprising said control signal;

said signal processor further comprising an output comprising a processed desired electrical signal; and a sound converter comprising an input and an output, said input comprising said processed desired electrical signal, and said output comprising said desired acoustic signal.

2. A device according to claim 1, wherein said at least one additional signal derived from said monitoring signal comprises a desired-signal component of said monitoring signal.

3. A device according to claim 1, wherein said at least one additional signal derived from said monitoring signal comprises the sum of a desired-signal component of said monitoring signal and a spurious-signal component of said monitoring signal.

4. A device according to claim 1, wherein said at least one additional signal derived from said monitoring signal comprises both a desired-signal component of said monitoring signal and the sum of a desired-signal component of said monitoring signal and a spurious-signal component of said monitoring signal.

5. A device according to claim 1, wherein said output of said extractor further comprises said at least one additional signal derived from said monitoring signal.

6. A device according to claim 1, wherein said input to said controller further comprises at least one state signal corresponding to at least one of a volume setting, an engine RPM and a vehicle speed.

7. A device according to claim 1, wherein said extractor further comprises at least one adaptive filter.

8. A device according to claim 1, wherein said input of said extractor further comprises said processed desired signal.

9. A device according to claim 1, wherein said input of said extractor further comprises said desired electrical signal.

10. A method for the noise-dependent adjustment of a desired acoustic signal radiated at a monitoring point, said method comprising the steps of:

generating a desired electrical signal;

monitoring a desired acoustic signal and an acoustic noise signal;

generating a monitoring signal from said desired acoustic signal and said acoustic noise signal;

extracting from said monitoring signal at least a noise-signal component thereof;

generating a control signal from both said noise-signal component of said monitoring signal and at least one additional signal derived from said monitoring signal;

generating a processed desired electrical signal from said desired electrical signal and said control signal; and generating said desired acoustic signal from said processed desired electrical signal.

11. The method according to claim 10, wherein said at least one additional signal derived from said monitoring signal of said step of generating a control signal comprises:

the sum of a desired-signal component of said monitoring signal and a spurious-signal component of said monitoring signal.

12. The method according to claim 10, wherein said at least one additional signal derived from said monitoring signal of said step of generating a control signal comprises:

a desired-signal component of said monitoring signal.

* * * * *